(12) United States Patent
Adachi

(10) Patent No.: US 11,069,828 B2
(45) Date of Patent: Jul. 20, 2021

(54) METHOD FOR MANUFACTURING PHOTOELECTRIC CONVERSION DEVICE

(71) Applicant: KANEKA CORPORATION, Osaka (JP)

(72) Inventor: Daisuke Adachi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/729,191

(22) Filed: Dec. 27, 2019

(65) Prior Publication Data

US 2020/0144440 A1    May 7, 2020

Related U.S. Application Data

(63) Continuation of application No. PCT/JP2018/024009, filed on Jun. 25, 2018.

(30) Foreign Application Priority Data

Jun. 28, 2017  (JP) .............................. JP2017-126782

(51) Int. Cl.
| | |
|---|---|
| *H01L 21/00* | (2006.01) |
| *H01L 31/18* | (2006.01) |
| *C23C 16/24* | (2006.01) |
| *C23C 16/50* | (2006.01) |
| *H01L 31/0747* | (2012.01) |

(52) U.S. Cl.
CPC .......... *H01L 31/1804* (2013.01); *C23C 16/24* (2013.01); *C23C 16/50* (2013.01); *H01L 31/0747* (2013.01)

(58) Field of Classification Search
CPC ............. H01L 31/1804; H01L 31/0747; H01L 21/02274; H01L 21/28556–28562; H01L 21/02381; H01L 21/0245; H01L 21/02532; C23C 16/24; C23C 16/50–517; C23C 16/45536–45542; C23C 14/14–205; C01B 33/02–039; C01B 33/04–046; C01B 33/107–10794
USPC ........................................................ 438/96
See application file for complete search history.

(56) References Cited

U.S. PATENT DOCUMENTS

| 5,635,408 A | 6/1997 | Sano et al. |
| 2002/0069911 A1 | 6/2002 | Nakamura et al. |
| 2013/0102133 A1 | 4/2013 | Sheng et al. |
| 2013/0210185 A1* | 8/2013 | Yoshimi ............. H01L 31/1868 438/57 |
| 2015/0372166 A1 | 12/2015 | Tsunomura et al. |
| 2017/0155007 A1* | 6/2017 | Terashita ............ H01L 31/0747 |
| 2018/0062005 A1 | 3/2018 | Uto et al. |
| 2018/0301582 A1 | 10/2018 | Uto et al. |

FOREIGN PATENT DOCUMENTS

| JP | 2002-076409 A | 3/2002 |
| JP | 2013-236020 A | 11/2013 |
| JP | 2014-049675 A | 3/2014 |
| JP | 2014-072406 A | 4/2014 |
| WO | 2012-043124 A1 | 4/2012 |
| WO | 2012/085155 A2 | 6/2012 |
| WO | 2016/152228 A1 | 9/2016 |
| WO | 2017/110457 A1 | 6/2017 |

OTHER PUBLICATIONS

International Preliminary Report on Patentability issued in International Application No. PCT/JP2018/024009, dated Dec. 31, 2019 (9 pages).
International Search Report issued in International Application No. PCT/JP2018/024009, dated Jul. 24, 2018 (2 pages).
Written Opinion issued in International Application No. PCT/JP2018/024009, dated Jul. 24, 2018 (5 pages).
Extended European Search Report issued in corresponding European Application No. 18822925.6, dated Feb. 19, 2021 (7 pages).

* cited by examiner

*Primary Examiner* — Calvin Y Choi
(74) *Attorney, Agent, or Firm* — Osha Bergman Watanabe & Burton LLP

(57) ABSTRACT

A method for manufacturing a crystalline silicon-based solar cell includes performing a plasma treatment on a plurality of conductive single-crystalline silicon substrates in a chemical vapor deposition (CVD) chamber, each of the conductive single-crystalline silicon substrates having an intrinsic silicon-based layer on a first principal surface thereof. The first principal surface of the conductive single-crystalline silicon substrate may have a pyramidal texture that comprises a plurality of projections having a top portion, a middle portion, and a valley portion. The plasma treatment may include introducing a hydrogen gas and a silicon-containing gas into the CVD chamber and exposing a surface of the intrinsic silicon-based layer to hydrogen plasma. An amount of the hydrogen gas introduced into the CVD chamber during the plasma treatment may be 150 to 2500 times an amount of the silicon-containing gas introduced into the CVD chamber.

15 Claims, 3 Drawing Sheets

METHOD FOR MANUFACTURING PHOTOELECTRIC CONVERSION DEVICE

TECHNICAL FIELD

One or more embodiments of the invention relate to a method for manufacturing a crystalline silicon-based photoelectric conversion device having a heterojunction on a surface of a single-crystalline silicon substrate.

BACKGROUND

As a solar cell with high conversion efficiency, a heterojunction solar cell having an amorphous silicon thin-film on a surface of a single-crystalline silicon substrate is known. In a heterojunction solar cell, an intrinsic silicon-based layer is inserted between a single-crystalline silicon substrate and a conductive silicon-based thin-film to attain a passivation effect such as termination of defects (mainly dangling bonds of silicon) present on a surface of the crystalline silicon substrate with hydrogen.

An intrinsic silicon-based thin-film on a single-crystalline silicon substrate is generally deposited by plasma-enhanced CVD using a silicon-containing gas such as silane ($SiH_4$). Intrinsic silicon-based thin-films may cause power generation loss resulting from light absorption and electric resistance. In order to reduce power generation loss while enhancing the passivation effect on a silicon substrate, several attempts have been proposed regarding a method for forming an intrinsic silicon-based thin-film for a heterojunction solar cell.

Patent Document 1 suggests that light absorption is reduced by widening the optical band gap of intrinsic silicon from the crystalline silicon substrate side toward the conductive silicon-based thin-film side. Specifically, a 4 nm-thick intrinsic amorphous silicon layer is formed on a crystalline silicon substrate by plasma-enhanced CVD using only silane gas, a 4 nm-thick intrinsic amorphous silicon layer is then formed thereon while 20 parts of hydrogen is introduced based on 1 part of silane, so that the band gap of the intrinsic amorphous silicon layer on the conductive silicon-based thin-film side is widened.

Patent Document 2 discloses a method in which an intrinsic amorphous silicon layer having a thickness of 1 to 3 nm is formed on a crystalline silicon substrate by plasma-enhanced CVD with 6 pars of hydrogen introduced based on 1 part of silane, and an intrinsic microcrystalline silicon-based layer having a thickness of 3 nm or more is then formed with 100 parts of hydrogen introduced based on 1 part of silane. Patent Document 2 suggests that a microcrystalline silicon-based layer arranged between an intrinsic amorphous silicon layer and a conductive silicon-based thin-film behaves as a block layer which prevents diffusion of hydrogen from the intrinsic amorphous silicon layer to the conductive silicon-based thin-film and diffusion of a dopant from the conductive silicon-based thin-film to the intrinsic amorphous silicon layer.

Patent Document 3 suggests a method in which an intrinsic amorphous silicon layer having a thickness of 1 to 10 nm is formed on a crystalline silicon substrate, and hydrogen plasma treatment is then performed, followed by forming an intrinsic amorphous silicon layer. When an intrinsic amorphous silicon layer is formed, and hydrogen plasma treatment is then performed, a surface of a crystalline silicon substrate is exposed to hydrogen plasma through the silicon layer, and therefore a passivation effect can be exerted on the substrate surface while plasma damage to the surface of the crystalline silicon substrate is suppressed. Patent Documents 4 and 5 suggest that formation of an intrinsic amorphous silicon layer and hydrogen plasma treatment are repeatedly performed.

Patent Document 5 suggests that not only a passivation effect is attained by a hydrogen plasma treatment, but also the passivation effect is improved by performing chemical vapor deposition (CVD) while introducing hydrogen in an amount of 2 to 6 times the amount of a raw material gas such as silane during formation of the intrinsic amorphous silicon layer.

Patent Document 1: Japanese Patent Laid-open Publication No. 2002-76409
Patent Document 2: Japanese Patent Laid-open Publication No. 2014-49675
Patent Document 3: International Publication No. WO 2012/043124
Patent Document 4: Japanese Patent Laid-open Publication No. 2014-72406
Patent Document 5: International Publication No. WO 2012/085155

As disclosed in Patent Documents 3 to 5, improvement of the conversion efficiency of a heterojunction solar cell by reduction of defects at the interface or improvement of film quality can be expected when a hydrogen plasma treatment is performed after deposition of an intrinsic silicon-based layer on a single-crystalline silicon substrate. In particular, when the power density during the hydrogen plasma treatment is increased, the film quality improving effect may be improved while the intrinsic silicon-based layer is etched by the hydrogen plasma.

In mass production of crystalline silicon-based solar cells, commonly a plurality of silicon substrates are mounted on a deposition tray, and a silicon-based layer is deposited by plasma-enhanced CVD. A hydrogen plasma treatment of a silicon-based layer can be performed with a deposition tray set in a CVD chamber for deposition of the silicon-based layer.

SUMMARY

It has been found that a difference in position of the silicon substrate in a CVD chamber may cause a variation in conversion characteristics, particularly in open circuit voltage (Voc) when a hydrogen plasma treatment is performed on a plurality of silicon substrates mounted on a deposition tray. In particular, when deposition is continuously performed in a plurality of batches while deposition trays are replaced without carrying out maintenance of the inside of a CVD chamber, a difference in characteristics due to a difference in position the silicon substrate in the chamber (between a cell prepared with a substrate placed at the central portion on the tray and a cell prepared with the substrate placed in the vicinity of the end portion on the tray) may become marked with an increase in the number of continuous deposition batches.

When a plurality of cells are connected in series to modularize solar cells, the current of a cell showing the smallest current value is a bottleneck of the current of the module. When a plurality of cells are connected in parallel to modularize solar cells, the voltage of a cell showing the smallest voltage value is a bottleneck of the voltage of the module. That is, in a solar cell module in which a plurality of cells are connected in series and/or in parallel, module efficiency depends on a cell having the poorest characteristics. Thus, when there is a large cell characteristic variation within one batch or among batches during preparation of cells, module efficiency is considerably deteriorated.

In view of the above-described situation, one or more embodiments of the present invention provide a method for manufacturing a heterojunction solar cell suitable for mass production, wherein conversion characteristics can be improved by a hydrogen plasma treatment of an intrinsic silicon-based layer, and a cell characteristic variation within one batch and among batches can be suppressed even when the number of continuous deposition batches is increased.

One or more embodiments of the present invention relate to a method for manufacturing a crystalline silicon-based solar cell including an intrinsic silicon-based thin-film and a conductive silicon-based thin-film in this order on one principal surface of a conductive single-crystalline silicon substrate. After deposition of an intrinsic silicon-based layer, the surface of the silicon-based layer is exposed to hydrogen plasma by a plasma treatment. When a slight amount of silicon-containing gas is included in an atmosphere during the plasma treatment, high conversion characteristics can be exhibited, and a variation in cell characteristics can be suppressed even when the number of continuous deposition batches increases.

In the method for manufacturing a crystalline silicon-based solar cell according to one or more embodiments of the present invention, a plasma treatment is performed. In the plasma treatment, the surface of an intrinsic silicon-based layer is exposed to hydrogen plasma with a hydrogen gas and silicon-containing gas being introduced into a CVD chamber in a state where a plurality of substrates with an intrinsic silicon-based layer provided on a conductive single-crystalline silicon substrate having textured surface are disposed in the CVD chamber. The amount of hydrogen introduced into the CVD chamber during the plasma treatment is 150 to 2500 times the introduction amount of the silicon-containing gas.

At texture valley portions, a thin-film is formed on the intrinsic silicon-based layer at texture valley portions by plasma treatment. Accordingly, the thickness of the silicon-based thin-film at the texture valley portions becomes larger than that before plasma treatment. The thin-film formed by plasma treatment may be an intrinsic amorphous silicon thin-film.

In one or more embodiments, the power density during the plasma treatment may be 55 to 1000 mW/cm². The product of the power density during the plasma treatment and the ratio of the introduction amount of the hydrogen gas to the introduction amount of the silicon-containing gas may be 15000 to 150000 mW/cm².

In one or more embodiments, the deposition rate in the plasma treatment may be 0.1 nm/second or less. The difference $d_1-d_0$ between the thickness $d_1$ of the intrinsic silicon-based thin-film after the plasma treatment and the thickness $d_0$ of the intrinsic silicon-based thin-film before the plasma treatment may be 1.5 nm or less. The value of $(d_1-d_0)/d_1$ may be larger than 0 and not more than 0.2.

Preferably, the intrinsic silicon-based layer of one or more embodiments is formed by plasma-enhanced CVD with a silicon-containing gas being introduced into a CVD chamber. For forming the intrinsic silicon-based layer, hydrogen may be introduced into the CVD chamber in addition to the silicon-containing gas. The amount of hydrogen introduced into the CVD chamber during formation of the intrinsic silicon-based layer may be less than 50 times the introduction amount of the silicon-containing gas.

Formation of the intrinsic silicon-based thin-film between the conductive single-crystalline silicon substrate and the conductive silicon-based thin-film may divided into a plurality of times of sublayer deposition in the thickness direction, and a surface of at least one of sublayers is subjected to plasma treatment. When the formation of the intrinsic silicon-based thin-film is divided into deposition of n sublayers including first to nth sublayers in this order from the conductive single-crystalline silicon substrate side, the plasma treatment is performed after deposition of any one of the sublayers. In particular, it may be possible that the plasma treatment is performed after deposition of the first sublayer that is in contact with the conductive single-crystalline silicon substrate and after deposition of the nth sublayer that will be in contact with the conductive silicon-based thin-film.

n is an integer of 2 or more. For example, when n is 2, the intrinsic silicon-based thin-film is formed by depositing the first sublayer and the second sublayer and the surface(s) of the first sublayer and/or the second sublayer is subjected to plasma treatment. Preferably, each of the sublayers is deposited to have a thickness of 1 to 6 nm. In particular, it may be that the first sublayer which is in contact with the silicon substrate is deposited to have a thickness of 1 to 6 nm.

According to the method of one or more embodiments of the present invention, a crystalline silicon-based solar cell with high conversion efficiency can be obtained. In addition, even when the number of continuous deposition batches is increased, the cell characteristic variation within one batch and among batches is small, so that the quality of the cell can be stabilized. Thus, the frequency of maintenance of the inside of a CVD chamber can be reduced to improve the production efficiency of the solar cell. Further, since the cell characteristic variation is small, module characteristics can be improved when a solar cell module is prepared by electrically connecting a plurality of cells.

DETAILED DESCRIPTION

Figure 1:
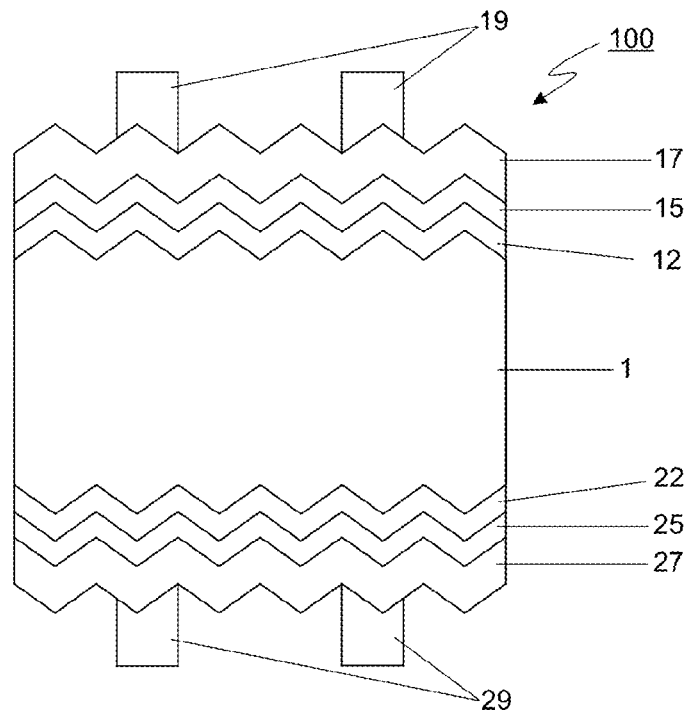
FIG. 1 is a schematic sectional view showing one or more embodiments of a crystalline silicon-based solar cell.

FIG. 1 is a schematic sectional view showing a crystalline silicon-based solar cell of one or more embodiments. A solar cell 100 in FIG. 1 includes intrinsic silicon-based thin-films 12 and 22 and conductive silicon-based thin-films 15 and 25 in this order on a first principal surface (p-layer side) and a second principal surface (n-layer side), respectively, of the silicon substrate 1. The conductive silicon-based thin-film 15 on the first principal surface and the conductive silicon-based thin-film 25 on the second principal surface have different conductivity-types. In other words, the conductive silicon-based thin-film 15 on the first principal surface is p-type, and the conductive silicon-based thin-film 25 on the second principal surface is n-type. Transparent electroconductive layers 17 and 27 and metal electrodes 19 and 29 are formed on the conductive silicon-based thin-films 15 and 25, respectively.

The silicon substrate 1 is an n-type or p-type conductive single-crystalline silicon substrate. In general, an electron has a higher mobility than a hole. Thus, when the silicon substrate 1 is an n-type single-crystalline silicon substrate, the conversion characteristics of the solar cell may be improved. A light-receiving surface of the solar cell 100 may be either on the p-layer side or on the n-layer side. In the heterojunction solar cell, when a heterojunction on the light-receiving side is a reverse junction, a strong electric field is formed, so that photoproduction carriers (electrons and holes) can be efficiently separated and recovered. Thus, when the silicon substrate has n-type conductivity, it may be that the light-receiving surface is on the p-layer side. When a patterned metal electrode is provided on each of both transparent electroconductive layers as shown in FIG. 1, both the surfaces on the p-layer side and the n-layer side may be a light-receiving surface.

From a viewpoint of light confinement, in one or more embodiments a pyramidal texture (uneven structure) is formed on a surface of the silicon substrate 1. The single-crystalline silicon substrate preferably has plane orientation of (100) plane in order to form a texture on its surface. This is because when the single-crystalline silicon substrate is etched, a pyramidal textured structure is easily formed by anisotropic etching that exploits the difference in etching rate between the (100) plane and the (111) plane.

The intrinsic silicon-based thin-films 12 and 22 and the conductive silicon-based thin-films 15 and 25 are thin-films composed of a silicon-based material. Since the intrinsic silicon-based thin-films 12 and 22 are disposed between the single-crystalline silicon substrate 1 and the conductive silicon-based thin-films 15 and 25, respectively, a surface of the silicon substrate is effectively passivated.

The intrinsic silicon-based thin-film of one or more embodiments is a silicon-based thin-film which does not contain a dopant, or has an extremely low dopant concentration. Specifically, the dopant concentration of each of the intrinsic silicon-based thin-films 12 and 22 is not more than 1/20 of the dopant concentration of the p-type or n-type silicon-based thin-film 15 or 25. The dopant concentration of each of the intrinsic silicon-based thin-films 21 and 22 may be not more than 1/100 of the dopant concentration of each of conductive silicon-based thin-films 15 and 25. It is especially preferable that the intrinsic silicon-based thin-films 12 and 22 do not contain a dopant. For improving the passivation effect on the surface of the silicon substrate, the intrinsic silicon-based thin-films 12 and 22 are preferably non-doped hydrogenated silicon substantially composed of silicon and hydrogen. Examples of the silicon-based material include silicon alloys such as silicon carbide, silicon nitride and silicon germanium in addition to silicon.

Although the deposition method of silicon-based material is not particularly limited, a plasma-enhanced CVD may be possible. In plasma-enhanced CVD, deposition and plasma treatment can be performed in the same chamber, so that the process can be simplified.

In one or more embodiments, a raw material gas used for deposition of the silicon-based material by plasma-enhanced CVD may be a silicon-containing gas such as $SiH_4$ or $Si_2H_6$. A law material gas diluted with, for example, $H_2$ may be introduced to a chamber. A dopant gas for forming the conductive (p-type or n-type) silicon may be, for example, $B_2H_6$ or $PH_3$. The amount of impurity such as P or B added is sufficient to be a trace amount; thus, a mixed gas wherein a dopant gas is beforehand diluted with the law material gas, $H_2$ or the like may be used. A gas containing a different element, such as $CH_4$, $CO_2$, $NH_3$ or $GeH_4$, may be added to the aforementioned gas to deposit a silicon alloy, such as silicon carbide, silicon nitride and silicon germanium, as the silicon-based layer. Deposition conditions of plasma-enhanced CVD are preferably as follows: a substrate temperature of 100 to 300° C.; a pressure of 20 to 2600 Pa; and a high-frequency power density of 3 to 500 mW/cm².

[Deposition on Silicon Substrate and Plasma Treatment]

In one or more embodiments, t least one of the intrinsic silicon-based thin-film 12 on the first principal surface of the silicon substrate 1 and the intrinsic silicon-based thin-film 22 on the second principal surface of the silicon substrate 1 is subjected to a plasma treatment. The plasma treatment is performed in a silicon-containing hydrogen atmosphere with a hydrogen gas and silicon-containing gas being introduced into a CVD chamber.

Hereinafter, by way of illustrating formation of the intrinsic silicon-based thin-film 12 on the first principal surface of the silicon substrate 1 is taken as an example, plasma treatment on a surface of an intrinsic silicon-based layer will be described.

<Deposition of Intrinsic Silicon-Based Layer>

In one or more embodiments, the intrinsic silicon-based layer is deposited by plasma-enhanced CVD. In deposition of the intrinsic silicon-based layer by plasma-enhanced CVD, the silicon substrate is introduced into a chamber of a plasma-enhanced CVD apparatus at the setout. A plurality of silicon substrates may be mounted on a mounting member such as a deposition tray, and introduced into the chamber. In addition, the silicon substrate may be fixed at a predetermined position in the chamber by a suction method or the like. By introducing a plurality of silicon substrates into the chamber, and performing deposition on a plurality of silicon substrates in one batch, the production efficiency of the solar cell can be improved.

After introduction of the silicon substrate into the chamber, the substrate is heated as necessary. Thereafter, a silicon-containing gas and a diluting gas such as hydrogen as necessary are introduced into the chamber, and the intrinsic silicon-based layer is deposited on the silicon substrate 1.

The intrinsic silicon-based layer of one or more embodiments is adjacent to the silicon substrate, and acts as a passivation layer on a surface of the silicon substrate. For effectively passivating the surface, an initially deposited portion in the vicinity of the interface with the silicon substrate may be amorphous. Thus, it may be that the intrinsic silicon-based layer is deposited at a high rate. The deposition rate of the intrinsic silicon-based layer may be 0.1 nm/second or more, 0.15 nm/second or more, or 0.2 nm/second or more. By increasing the deposition rate, epitaxial growth of silicon is suppressed, so that an amorphous film is easily formed.

The deposition rate of a film on a textured substrate is a value obtained by dividing by a deposition time a thickness determined by observing a cross-section with a transmission electron microscope (TEM) with the thickness direction being a direction perpendicular to the slope of the texture. A film formed by plasma-enhanced CVD on a textured substrate generally may have a large thickness at tip (top) portions of projection, and a small thickness on middle portions and valley portions of the projection (see, for example, WO 98/43304). In the following, unless otherwise specified, the thickness and the deposition rate at valley portions of projection are the thickness and the deposition rate on a textured substrate. The projection is divided into 3 equal parts in the height direction, a region which is the farthest from the surface (top) and occupies ⅓ of the projection is a "top portion", a region which is the farthest from the surface and occupies ⅓ of the projection is a "valley portion", and a region which is present between the top portion and valley portion and occupies ⅓ of the projection is a "middle portion". The thickness of the valley portion refers to the thickness at the center of the valley portion (portion ⅙ times the height of the projection).

<Plasma Treatment>

In one or more embodiments, a plasma treatment is performed with a hydrogen gas and silicon-containing gas being introduced into a CVD chamber in a state where a plurality of substrates with the intrinsic silicon-based layer provided on the silicon substrate are disposed in the CVD chamber. The conversion characteristics of the solar cell, especially the open circuit voltage (Voc) and fill factor (FF) tend to be improved by exposing the surface of the intrinsic silicon-based layer to hydrogen plasma in the plasma treatment. In one or more embodiments of the present invention, a silicon-containing gas such as $SiH_4$ is introduced into a CVD chamber in addition to hydrogen in the plasma treatment, so that a characteristic variation within one batch and among batches is suppressed even when the number of continuous deposition batches increases.

Figure 2A:
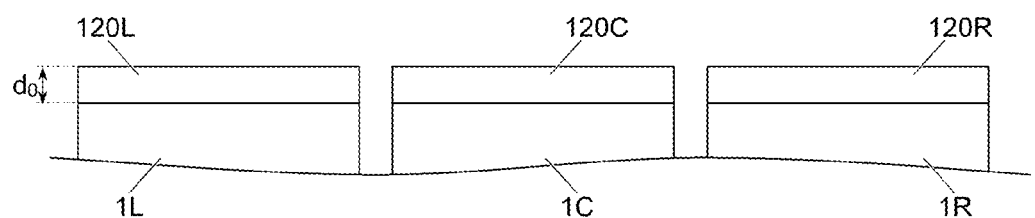
FIGS. 2A-B are conceptual views for explaining thickness change when a plurality of substrates are subjected to hydrogen plasma etching in one chamber of one or more embodiments.
Figure 2B:
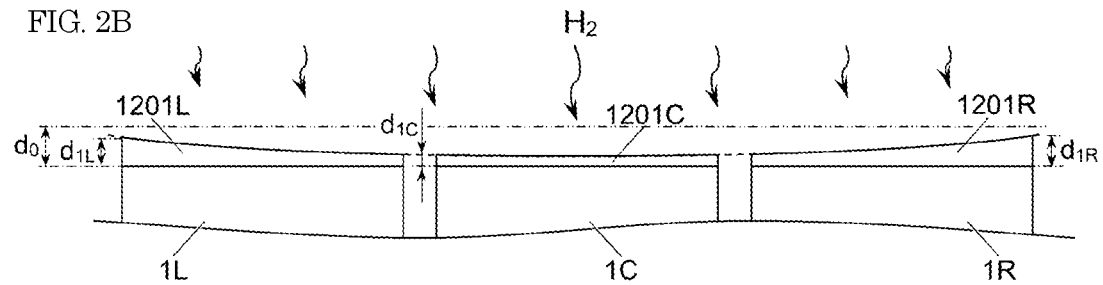
Figure 3A:
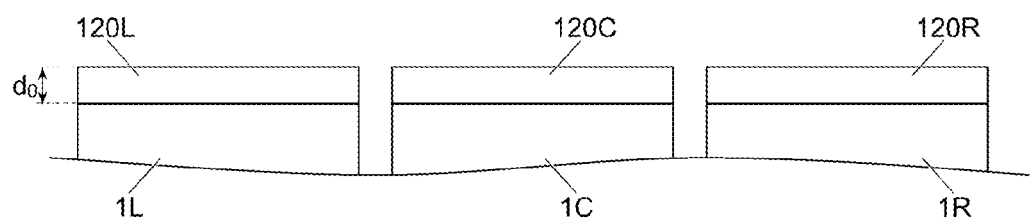
FIGS. 3A-B are conceptual views for explaining a plasma treatment of one or more embodiments of the present invention.
Figure 3B:
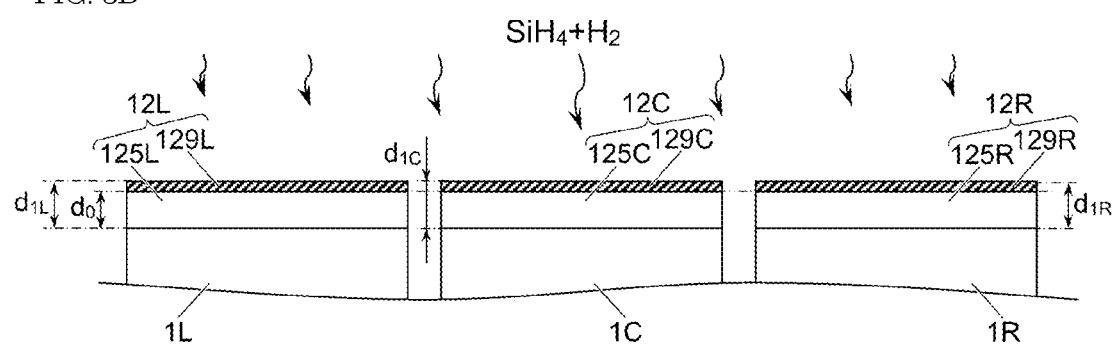

FIGS. 2A-B are conceptual views showing an outline of a common hydrogen plasma treatment in a conventional technique, and FIGS. 3A-B are conceptual views showing an outline of a plasma treatment of one or more embodiments of the present invention. FIGS. 2A-B and 3A-B show a state in which the three silicon substrates 1L, 1C, and 1R are arranged in one direction, and hydrogen plasma treatment is performed. In order to simplify explanation regarding a thickness change and a thickness distribution, texture of the substrate is not shown in FIGS. 2A-B and 3A-B.

(Hydrogen Plasma Treatment in Conventional Technique)

In common hydrogen plasma treatments, first, intrinsic silicon-based layers 120L, 120C and 120R having a thickness $d_0$ are formed on principal surfaces of three silicon substrates 1L, 1C and 1R, respectively (FIG. 2A). As described above, the thickness of the intrinsic silicon-based layer on a textured substrate differs at the top portion and the valley portion of the texture in the microscopic sense, but in the sense of the average thickness on a single substrate, the intrinsic silicon-based layers 120L, 120C and 120R are not clearly different in thickness.

Thereafter, plasma discharge is performed with hydrogen being introduced into a CVD chamber, and resultantly the surface of the intrinsic silicon-based layer is exposed to hydrogen plasma, so that the thickness is decreased by hydrogen plasma etching. Thus, the thickness of each of intrinsic silicon-based thin-films 1201L, 1201C and 1201R after plasma treatment is smaller than the thickness of each of the intrinsic silicon-based layers 120L, 120C and 120R before plasma treatment (FIG. 2B).

In common hydrogen plasma etching, a hydrogen gas, or a mixed gas of a hydrogen gas and an inert gas is used. When the plasma power density during hydrogen plasma etching is increased, the passivation effect by hydrogen plasma may be improved. When hydrogen plasma treatment is performed at a high power density, the conversion characteristics of the solar cell may vary depending on a position (deposition position) of the silicon substrate in a chamber, leading to occurrence of a cell characteristic variation within one batch. It has been found that in particular, when deposition is continuously performed in a plurality of batches while silicon substrates are replaced without carrying out maintenance of the inside of a CVD chamber, a variation in conversion characteristics may increase with an increase in the number of continuous deposition batches.

The thickness of the intrinsic silicon-based layer after hydrogen plasma etching may be smaller on a silicon substrate 1C disposed in the vicinity of the center of the deposition plane (center of parallel plate electrode) in a chamber (for example, substrate mounted in the vicinity of the center of a deposition tray) than on a silicon substrate 1L or 1R disposed at the end portion of the deposition plane (for example, substrate mounted at the end portion of the deposition tray).

The thickness after hydrogen plasma etching of one or more embodiments is relatively small in the vicinity of the center in the chamber. This phenomenon may be associated with the relatively large amount of plasma etching in the vicinity of the center in the chamber. This state is schematically shown in FIG. 2B. In FIG. 2B, the length of the arrow corresponds to the plasma intensity, and a state is schematically shown in which the etching amount at the central portion is large because the plasma intensity at the central portion is larger than that at the end portion. Since the plasma etching amount at the central portion is relatively large, the thickness $d_{1C}$ of the intrinsic silicon-based layer 1201C on the silicon substrate 1C at the center is smaller than each of the thicknesses $d_{1L}$ and $d_{1R}$ of the intrinsic silicon-based layers 1201L and 1201R on the silicon substrates 1L and 1R at the end portions.

The phenomenon in which the plasma etching amount in the vicinity of the center is relatively large may be ascribable to the influence of a plasma intensity distribution in the deposition plane. During chemical vapor deposition, the plasma power density is low, so that the distribution of plasma power in the deposition plane is small, leading to a small variation in deposition thickness $d_0$. On the other hand, it is considered that since hydrogen plasma etching is performed at a higher power density than that in deposition of an amorphous silicon layer, the plasma intensity distribution in the deposition plane increases, and the in-plane distribution of the plasma intensity causes an in-plane distribution of the plasma etching amount (distribution of the thickness after plasma etching).

In one or more embodiments, an increase in the number of continuous deposition batches may expand the thickness difference in a batch, which accordingly increases a variation in conversion characteristics of the solar cells. In a deposition batch immediately after maintenance, such as cleaning, of the inside of a chamber is carried out, the variation in thickness changes due to the hydrogen plasma treatment within one batch is small because the distribution of the plasma intensity in the deposition plane is small. It is supposed that an in-plane distribution of the plasma intensity occurs such that the plasma intensity in the vicinity of the central portion is larger than that in the vicinity of the end portion as schematically shown in FIG. 2B due to, for example, an increase in stacking amount of a film accumulated on a chamber inner wall etc. with an increase in the number of continuous deposition batches.

In one or more embodiments the plasma intensity distribution and the thickness distribution are small within the range of the size of one silicon substrate (e.g., about 6 inches) to be used for the solar cell, but when a plurality of silicon substrates are treated in one batch, the thickness distribution between the substrates may be conspicuous. It has been found that the thickness distribution between the substrates in a batch may increase as the number of substrates treated one time is increased with a large CVD chamber having a large deposition area. This tendency is remarkable when the deposition area is 0.3 m² or more, and this tendency is particularly remarkable when the deposition area is 0.5 m² or more.

(Hydrogen Plasma Treatment of One or More Embodiments of the Present Invention)

In one or more embodiments of the present invention, a plasma treatment is performed with a silicon-containing gas being introduced into a CVD chamber in addition to hydrogen. FIGS. 3A-B are conceptual views showing an outline of a plasma treatment of one or more embodiments of the present invention. First, as in the case with FIG. 2A, the intrinsic silicon-based layers 120L, 120C and 120R each having a thickness $d_0$ is formed on a principal surface of each of the silicon substrate 1L, 1C and 1R (FIG. 3A). Thereafter, plasma discharge is performed with hydrogen and a silicon-containing gas being introduced into the CVD chamber to perform a plasma treatment (FIG. 3B). As the silicon-containing gas, $SiH_4$, $Si_2H_6$ or the like is used as in the case of a raw material gas that is used for chemical vapor deposition.

The amount of hydrogen introduced into the CVD chamber during the plasma treatment is set to 150 to 2500 times the introduction amount of the silicon-containing gas. The ratio of the introduction amount of hydrogen to the introduction amount of the silicon-containing gas (hydrogen dilution ratio) may be 200 to 1500, or 250 to 1000. The atmospheric gas during the plasma treatment may contain an inert gas such as a nitrogen, helium or argon gas, and contain a very small amount of a dopant gas such as a $B_2H_6$ or $PH_3$ gas. Preferably, the plasma treatment is performed in an atmosphere having a hydrogen concentration of 80% by volume or more. The hydrogen concentration during the plasma treatment is 90% by volume or more, or 95% by volume or more.

The substrate temperature during the plasma treatment may be 100° C. to 300° C. The pressure may be 20 Pa to 2600 Pa. From the viewpoint of improving the passivation effect by hydrogen plasma, it may be that the plasma treatment is performed at a high pressure with a hydrogen introduction amount larger than that during the chemical vapor deposition. The pressure during the plasma treatment is 100 Pa or more, or 150 Pa or more, especially preferably 200 Pa or more.

From the viewpoint of improving the passivation effect by hydrogen plasma, the plasma power density may be 55 mW/cm² or more, 60 mW/cm² or more, 70 mW/cm² or more, or 80 mW/cm² or more. On the other hand, when the power density during the plasma treatment is excessively high, it may be difficult to control the thickness. In addition, when the power density is excessively high, the film quality may be deteriorated, or plasma damage to a surface of the single-crystalline silicon substrate may occur, leading to deterioration of the conversion characteristics of the solar cell. Thus, the plasma power density during hydrogen plasma treatment may be 1000 mW/cm² or less, 800 mW/cm² or less, 400 mW/cm² or less, or 200 mW/cm² or less.

Generally, the introduction amount of a hydrogen gas in deposition of amorphous silicon is set to not more than 10 times the amount of a silicon-containing gas. It is known that microcrystalline silicon is formed when the ratio of the introduction amount of a hydrogen gas to the amount of a silicon-containing gas (hydrogen dilution ratio) increases. Generally, the hydrogen dilution ratio in deposition of microcrystalline silicon is about 30 to 100. In one or more embodiments of the present invention, a plasma treatment is performed under an atmosphere at a higher hydrogen concentration with a smaller amount of the silicon-containing gas as compared to general chemical vapor deposition of silicon material. Thus, in the plasma treatment of one or more embodiments of the present invention, etching of the surface of the intrinsic silicon-based layer by hydrogen plasma and the CVD film formation by a silicon-containing gas present in an atmosphere may competitively occur in parallel. Therefore, the rate of change in thickness (etching rate or deposition rate) by the plasma treatment is expressed by a difference between the etching rate by hydrogen plasma and the CVD film formation rate.

With an increase in the number of continuous deposition batches, an in-plane distribution of the plasma intensity occurs such that the plasma intensity in the vicinity of the central portion may be larger than that in the vicinity of the end portion as described above. In the plasma treatment of one or more embodiments of the present invention, the plasma etching amount (etching rate) and the amount of deposition (deposition rate) by CVD may be each relatively large at a site where the plasma intensity is relatively high when an in-plane distribution of the plasma intensity occurs. Similarly, the etching rate and the deposition rate may be relatively small at a site where the plasma intensity is relatively low.

In this way, by introducing a silicon-containing gas during the plasma treatment, the silicon-based material is formed by CVD so as to compensate for a decrease in thickness due to hydrogen plasma etching. It is thus considered that the thickness variation is small, so that a variation in conversion characteristics of the solar cells can be reduced even when an in-plane distribution of the plasma intensity occurs. In addition, in the plasma treatment of one or more embodiments of the present invention, the plasma power density and the hydrogen introduction amount (hydrogen partial pressure in a CVD chamber) are equivalent to those in a conventional hydrogen plasma treatment in which a silicon-containing gas is not used, and thus the hydrogen plasma amount is equivalent to that in the conventional hydrogen plasma treatment. Thus, a high passivation effect equivalent to that in the conventional hydrogen plasma treatment can be obtained while a thickness variation is suppressed.

When plasma treatment is performed while a silicon-containing gas is introduced in addition to hydrogen, an in-plane distribution of the plasma intensity may occur either when the thickness increases (deposition mode) and when the thickness decreases (etching mode) depending on conditions such as a gas introduction amount and a plasma power density. When the introduction amount of the silicon-containing gas is small, etching with hydrogen plasma is dominant, and so that the thickness is reduced as in the case shown in FIG. 2B. In one or more embodiments of the present invention, for reducing the thickness distribution among substrates due to plasma treatment, plasma treatment is performed in a deposition mode with the hydrogen introduction amount is set to not more than 2500 times the silicon-containing gas introduction amount.

On the other hand, when the hydrogen dilution ratio is excessively small, the deposition rate may increase, leading to reduction of plasma treatment effect. When the deposition amount during plasma treatment increases, the thickness distribution among substrates may increase. Thus, the hydrogen introduction amount in plasma treatment is set to not less than 150 times the silicon-containing gas introduction amount.

As the plasma power density increases and the hydrogen dilution ratio becomes larger (silicon-containing gas introduction amount becomes smaller), the plasma etching rate may increase, leading to decrease in deposition rate during plasma treatment. From the viewpoint of attaining both the passivation effect and reduction of a thickness variation, the product of the power density during the plasma treatment and the ratio of the introduction amount of the hydrogen gas to the introduction amount of the silicon-containing gas (hydrogen dilution ratio) may be 15000 to 150000 mW/cm$^2$. The product of the power density and the hydrogen dilution ratio is 20000 to 120000 mW/cm$^2$, 30000 to 100000 mW/cm$^2$, or 40000 to 90000 mW/cm$^2$. Deposition rate during the plasma treatment may be 0.1 nm/second or less, 0.02 to 0.08 nm/second, or 0.03 to 0.07 nm/second.

The difference $d_1-d_0$ between the thickness $d_1$ of the intrinsic silicon-based thin-film after the plasma treatment and the thickness $d_0$ of the intrinsic silicon-based layer before the plasma treatment may be larger than 0 and 1.5 nm or less, 0.1 to 1.2 nm, or 0.2 to 1 nm. As mentioned above, the thickness is a measured value at valley portions of projection. When there is a variation in deposition thickness or thickness change amount at valley portions during the plasma treatment in one silicon substrate, the difference $d_1-d_0$ at the in-plane central portion of the silicon substrate is defined as a thickness change amount. When a plurality of silicon substrates are subjected to plasma treatment in one batch, the average of differences $d_1-d_0$ at the in-plane central portion in each of the silicon substrates 1L, 1C and 1R is defined as a thickness change amount. The deposition rate during the plasma treatment is calculated from the difference $d_1-d_0$ and the plasma treatment time.

The ratio $(d_1-d_0)/d_1$ of the thickness change amount $d_1-d_0$ to the thickness $d_0$ before the plasma treatment may be larger than 0 and 0.2 or less, 0.01 to +0.15, or 0.03 to 0.1. Excessively large thickness change may cause large film quality may be large, leading to deterioration of the passivation effect on the silicon substrate by the intrinsic silicon.

In one or more embodiments of the present invention, thin-films 129L, 129C and 129R are formed at texture valley portions of the silicon substrate by plasma treatment. By the plasma treatment, thin-films may be formed on the middle and top portions of the texture, leading to increase in overall thickness on the silicon substrate. The deposition rate at the middle and top portions of the texture during plasma treatment is the same as the film formation rate at the valley portions, but at the top portions of the texture, the deposition rate during plasma treatment may be smaller as compared to the valley portions because the top portions are susceptible to plasma etching. By plasma treatment, the thickness may be increased at the texture valley portions, and decreased at the top portions of the texture. From the viewpoint of improving the characteristics by making the film thickness uniform over the entire surface of the silicon substrate, it may be that a thin-film is formed on the top portions of the texture by plasma treatment, so that the thickness of the entire thin-film on the silicon substrate increases. For forming a thin-film on the top portions of the texture, the hydrogen dilution ratio during plasma treatment may be 1000 or less, or 800 or less. The deposition rate at texture valley portion during plasma treatment may be 0.03 nm/second or more, and or 0.04 nm/second or more.

The plasma treatment time may be 3 seconds or more, 5 seconds or more, or 10 seconds or more. When the plasma treatment time is in the above-mentioned range, a passivation effect by hydrogen plasma can be obtained, so that improvement of the characteristics of the solar cell can be expected. Even when the plasma processing time is excessively long, further improvement of the passivation effect cannot be expected, and the thickness distribution may increase. Thus, the plasma treatment time may be 140 seconds or less, 100 seconds or less, or 60 seconds or less.

As described above, the initially deposited portion of the intrinsic silicon-based thin-film 12 may be amorphous for improving the function as a passivation layer on a surface of the silicon substrate 1. In addition, when the intrinsic silicon-based thin-film contains microcrystals, defects generated on the surfaces and in inner parts of the microcrystals tend to form carrier recombination centers, leading to deterioration in the conversion characteristics (particularly open circuit voltage) of the solar cell due to reduction of carrier lifetime. Thus, the thin-films 129L, 129C and 129R formed during plasma treatment are preferably amorphous films. When the plasma treatment atmosphere contains conductivity-type determination impurities such as B and P, the conductivity-type determination impurities may be mixed into the thin-film, leading to deterioration of characteristics. Thus, the thin-films 129L, 129C and 129R formed by plasma treatment are preferably thin-films of intrinsic amorphous silicon-based materials, especially preferably thin-films of intrinsic amorphous silicon.

When plasma-enhanced CVD is performed while about 100 parts of hydrogen is introduced based on 1 part of a silicon-containing gas such as $SiH_4$, microcrystalline silicon may be formed. On the other hand, for forming microcrystalline silicon, it is necessary to generate crystal nuclei. When the deposition thickness is small, crystal nuclei are not generated even at a high hydrogen dilution ratio, and amorphous silicon is easily formed. In particular, when the thickness is less than 2 nm, crystallization hardly occurs, and an amorphous silicon film is formed. When plasma treatment is performed at a hydrogen dilution ratio of 150 or more, the deposition rate is extremely small due to the influence of plasma etching, so that it is easy to control the thickness. Thus, in plasma treatment, generation of microcrystals can be suppressed by controlling the amount of thickness change so as not to generate microcrystalline silicon.

As described above, the silicon substrate is subjected to plasma treatment after formation of the intrinsic silicon-based layer. After formation of the intrinsic silicon-based layer by plasma-enhanced CVD, plasma treatment may be performed in the same CVD chamber without taking out the substrate. In this case, formation of the intrinsic silicon-based layer and the plasma treatment may be continuously performed, or plasma discharge may be temporarily stopped. When deposition of the intrinsic silicon-based layer and the plasma treatment are continuously performed, the supply of the raw material gas may be stopped in a state where plasma discharge is continued for reducing the concentration of the silicon-containing gas in the chamber. When plasma discharge is temporarily stopped after deposition of the intrinsic silicon-based layer, it may be possible that a gas in the chamber is replaced in a state where plasma discharge is stopped, so that the concentration of the raw material gas (silicon-containing gas) in the chamber is reduced, and after the inside of the chamber is brought into a gas atmosphere mainly composed of hydrogen, discharge is resumed to start the plasma treatment.

[Modification of Deposition and Plasma Treatment]

Although, in the one or more embodiments shown in FIGS. 3A-B, an intrinsic silicon-based layer having a thickness $d_0$ is formed on silicon substrate by performing CVD once, formation of the intrinsic silicon-based layer may be divided into a plurality of times of sublayer deposition processes. When a plural of sublayers are formed, the above-mentioned plasma treatment is performed after deposition of any one of the sublayers and before deposition of a next layer. The plasma treatment may be performed after deposition of each sublayer.

Figure 4A:
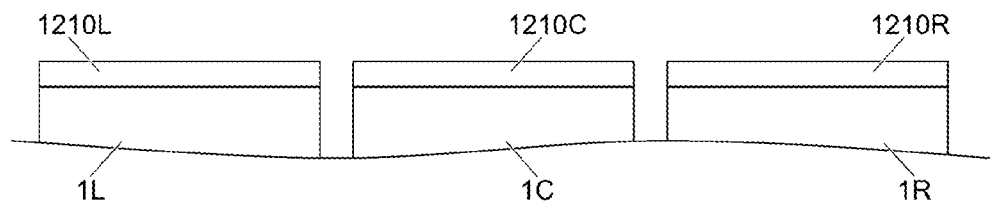
FIGS. 4A-D are conceptual views for explaining a plasma treatment to sublayers of one or more embodiments.
Figure 4B:
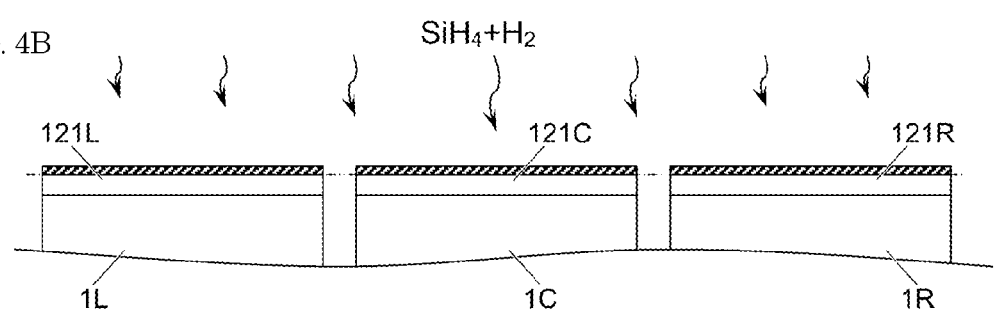
Figure 4C:
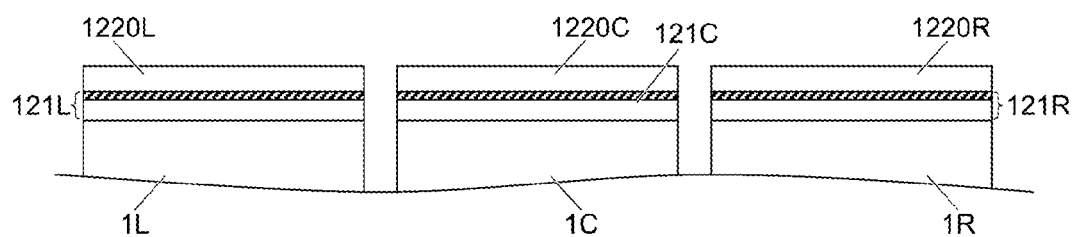
Figure 4D:
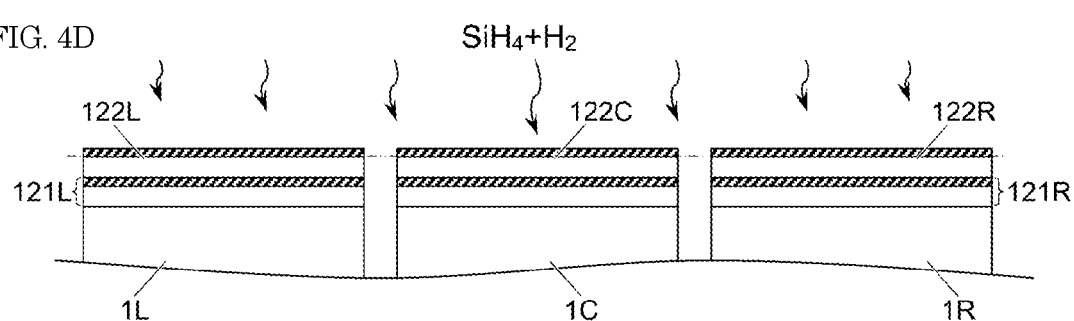

For example, as shown in FIGS. 4A-D, two layers: a first sublayer and a second sublayer may be deposited, and plasma treatment may be performed after deposition of each of the first and second sublayers. In the one or more embodiments shown in FIGS. 4A-D, first sublayers 121L, 121C and 121R are formed at first on principal surfaces of a plurality of silicon substrates 1L, 1C and 1R, respectively (FIG. 4A). Thereafter, a thin-film is formed by plasma treatment of the surfaces of the first sublayers 121L, 121C and 121R, so that the thickness of the first sublayer increases (FIG. 4B). Second sublayers 122L, 122C and 122R are formed on the first sublayers 121L, 121C and 121R after the plasma treatment (FIG. 4C). A thin-film is formed by plasma treatment of the surfaces of the second sublayers 122L, 122C and 122R, so that the thickness of the second sublayer increases (FIG. 4D).

The first sublayer and the second sublayer may be formed under the same deposition conditions as in deposition of the intrinsic silicon-based layer described above. By performing plasma treatment after formation of the first sublayer 1210L, 1210C and 1210R on the silicon substrate 1L, 1C and 1R and before formation of the second sublayers 1220L, 1220C and 1220R (hereinafter, sometimes referred to as "intermediate plasma treatment"), not only film quality but also a passivation effect on the interface between the intrinsic silicon-based thin-film 12 and the silicon substrate 1 is improved.

Improvement of the open circuit voltage by plasma treatment is supposed to be resulting from improvement of the film quality due to exposure to hydrogen plasma (termination of dangling bonds by introduction of hydrogen into the film), and improvement of interface characteristics.

By performing the intermediate plasma treatment after deposition of the first sublayers 1210L, 1210C and 1210R and before deposition of the second sublayers 1220L, 1220C and 1220R, a passivation effect can be exerted on surfaces of the silicon substrates 1L, 1C and 1R by hydrogen plasma through the first sublayers 1210L, 1210C and 1210R.

The first sublayers 1210L, 1210C and 1210R act as protecting layers for reducing plasma damage to a surface of the silicon substrate. By performing intermediate plasma treatment after deposition of the first sublayers, the conversion characteristics of the solar cell may be improved by exerting a passivation effect on the surface of the silicon substrate and an effect of reducing defects on the surface of the silicon substrate while plasma damage to the silicon substrates 1L, 1C and 1R.

When intermediate plasma treatment is performed after formation of the first sublayers, the thickness of each of the first sublayers deposited at texture valley portion before intermediate plasma treatment may be 1 to 6 nm, 1.5 to 5 nm, or 2 to 4 nm, from the viewpoint of attaining both reduction of plasma damage to the substrate and exertion of a passivation effect on the substrate surface. In addition, when the thickness of the first sublayer is within this range, an effect of improving film quality by plasma treatment is easily obtained over the entire first sublayer in the thickness direction.

When formation of the intrinsic silicon-based thin-film is divided into a plurality of times of sublayer deposition in the thickness direction, the thickness of the first sublayer can be set within the above-described range irrespective of the predetermined set total thickness of the intrinsic silicon-based thin-film 12. In addition, since the thickness of each sublayer can be set small, an effect of improving film quality by hydrogen plasma is easily obtained over the entire sublayer in the thickness direction.

When a plurality of sublayer are formed, as in the case with the first sublayer, deposition thickness of sublayer(s) other than the first sublayer may be 6 nm or less, 5 nm or less, or 4 nm or less. By decreasing the deposition thickness of each sublayer, the film quality improving effect by hydrogen plasma can be exerted on the entire sublayer in the thickness direction. The deposition thickness of each of sublayers may be 1 nm or more, 1.5 nm or more, or 2 nm or more. When the deposition thickness of each sublayer is excessively small, a coverage failure easily occurs. In addition, when the deposition thickness of each sublayer is excessively small, it is necessary to increase the number of deposition of sublayers required for forming the intrinsic silicon-based thin-film 12 having a desired thickness, so that production efficiency may be deteriorated. When the thickness of the first sublayer formed in contact with the silicon substrate is within the above-mentioned range, a passivation effect by hydrogen plasma can also be exerted on a surface of the silicon substrate 1 by the plasma treatment for the surface of the first sublayer, and plasma damage to the silicon surface can be reduced.

Since a thin-film is formed during plasma treatment, the thickness of each of the first sublayers 121L, 121C and 121R after plasma treatment is larger than the thickness of each of the first sublayers 1210L, 1210C and 1210R before the plasma treatment. As described above, even when an in-plane distribution is generated in plasma intensity as the number of continuous deposition batches increases, a thickness variation within one batch or among batches can be suppressed because the plasma etching amount and the amount of deposition by CVD are balanced.

Following to the plasma treatment of the first sublayers, second sublayers 1220L, 1220C and 1220R are formed (FIG. 4C). Thereafter, by subjecting the second sublayers to plasma treatment as shown in FIG. 4D, not only improvement of film quality by a passivation effect on the silicon-based layer, but also improvement of interfacial contact with the conductive silicon-based thin-film 15 formed on the second sublayers 122L, 122C and 122R can be expected.

The intrinsic silicon-based thin-film of one or more embodiments may be formed by stacking three or more sublayers. When the number n of stacked sublayers (n is an integer of 2 or more) is excessively large, series resistance may increase due to an increase in thickness of the intrinsic silicon-based thin-film, leading to deterioration of the fill factor of the solar cell. In addition, when the number n of stacked sublayers is large, production efficiency of the solar cell is deteriorated. Therefore, n may be 2 to 4, or 2 to 3, and particularly preferably n=2.

When the formation of the intrinsic silicon-based thin-film is divided into deposition of n sublayers including first to nth sublayers in this order from the silicon substrate side, a plasma treatment is performed, after formation of any one of the first to nth sublayers, by introducing a silicon-containing gas and hydrogen into the chamber. It may be possible a thin-film is formed on the surface of the sublayer after the plasma treatment.

When n is 3 or more, only one sublayer may be subjected to a plasma treatment, or a plurality of sublayers may be subjected to a plasma treatment. For example, when n is 3, an intermediate plasma treatment may be performed after deposition of the first sublayer, the third sublayer may be deposited without performing a hydrogen plasma treatment after deposition of the second sublayer, and the surface of the third sublayer may be subjected to a plasma treatment.

In addition, a plasma treatment may be performed after deposition of the first sublayer, after deposition of the second sublayer and after deposition of the third sublayer, respectively. Plasma treatment conditions for the sublayers may be the same or different.

The surface of the first sublayer may be subjected to an intermediate plasma treatment when n is 3 or more. As described above, by performing an intermediate plasma treatment to the surface of the first sublayer that is in contact with the silicon substrate 1, the passivation effect on a surface of the silicon substrate and the effect of reducing defects of the silicon substrate tend to be improved.

[Conductive Silicon-Based Thin-Film]

In one or more embodiments, a p-type silicon-based thin-film is formed as the conductive silicon-based thin-film 15 on the plasma treated intrinsic silicon-based thin-film 12. By forming the conductive silicon-based thin-film in contact with the plasma treated interface of the intrinsic silicon-based thin-film, interfacial contact may be improved, leading to improvement of conversion characteristics. The thickness of the conductive silicon-based thin-film may be in a range of 3 nm to 20 nm.

After the plasma treatment is performed, the p-type silicon-based thin-film 15 may be deposited in the same CVD chamber without taking out the substrate from the CVD chamber. By successively depositing the intrinsic silicon-based thin-film and the conductive silicon-based thin-film on the silicon substrate in the same CVD chamber, the process can be simplified to improve production efficiency of the solar cell. When the conductive silicon-based thin-film and the intrinsic silicon-based thin-film are deposited in the same CVD chamber, a dopant retained in the chamber may be caught in the intrinsic silicon-based thin-film. However, impurities have little influence on the passivation effect on the silicon substrate surface since impurities hardly diffuse to the silicon substrate when the intrinsic silicon-based thin-film has a thickness of 3 nm or more.

A case has been described above where the intrinsic silicon-based thin-film 12 and the p-type silicon-based thin-film 15 are formed on the silicon substrate 1 (formation of a silicon-based thin-film on the p-layer side), as an example. In the manufacturing method of the present invention, at least one of formation of the silicon-based thin-film on the p-layer side and formation of the silicon-based thin-film on the n-layer side may be performed by the above-mentioned method. Particularly, by forming the silicon-based thin-film on the p-layer side by the above-mentioned method, the conversion characteristics of the solar cell are remarkably improved. Further, when both the silicon-based thin-films on the p-layer side and the n-layer side are formed by the above-mentioned method, an effect of further improving conversion characteristics can be expected.

[Transparent Electroconductive Layer]

In one or more embodiments, transparent electroconductive layers 17 and 27 are formed on the conductive silicon-based thin-films 15 and 25, respectively. The transparent electroconductive layers are made of conductive oxide. As the conductive oxide, for example, zinc oxide, indium oxide and tin oxide can be used alone or in combination. Further, an electroconductive dopant may be added to these conductive oxides. Examples of the dopant added to zinc oxide include aluminum, gallium, boron, silicon and carbon. Examples of the dopant added to indium oxide include zinc, tin, titanium, tungsten, molybdenum and silicon. Examples of the dopant added to tin oxide include fluorine. Transparent electroconductive layer may be deposited as a single film, or deposited as a stack of films.

The thickness of the each of the transparent electroconductive layers 17 and 27 may be 10 nm or more and 140 nm or less from the viewpoints of transparency and electroconductivity. It suffices that the transparent electroconductive layer has electroconductivity required for transportation of a carrier to the collecting electrode. If the thickness of the transparent electroconductive layer is too large, the transmittance may be reduced due to the absorption losses of the transparent electroconductive layer itself, thus causing degradation in conversion characteristics of solar cell.

As the method for forming the transparent electroconductive layer, a physical vapor deposition method such as a sputtering method, chemical vapor deposition using a reaction of an organic metal compound with oxygen or water (MOCVD), or the like may be possible. In any deposition method, energy from heat, plasma discharge or the like may be used for deposition.

[Collecting Electrode]

In one or more embodiments, collecting electrodes 19 and 29 are formed on the transparent electroconductive layers 17 and 27, respectively. A metal such as silver, copper, gold, aluminum or tin is used as a material of the collecting electrode. The collecting electrode on the light-receiving side is formed in a pattern shape. The collecting electrode on the back side may be formed over the entire surface of the transparent electroconductive layer, or formed in a pattern shape. The pattern-shaped collecting electrode can be formed by application of an electroconductive paste, plating or the like. Examples of the method for applying an electroconductive paste on the transparent electroconductive layer include printing methods such as an inkjet printing method and a screen printing method, and a spray method.

[Modularization]

In one or more embodiments, the crystalline silicon-based solar cell may be modularized when put into practical use. Modularization of the solar cell is performed by an appropriate method. For example, a plurality of solar cells are connected in series or in parallel to form a solar cell string by connecting an interconnector such as a TAB onto the collecting electrode. A wiring for electrically connecting the solar cell or solar cell string to an external line is connected, and encapsulated with an encapsulant and a glass plate or the like to obtain a solar cell module.

In a solar cell module of one or more embodiments in which a plurality of cells are connected in series and/or in parallel, module efficiency depends on characteristics of a cell having the poorest characteristics. According to the manufacturing method of the present invention, a crystalline silicon-based solar cell having excellent conversion characteristics and a reduction of conversion characteristic variation within one batch or among batches can be attained as described above. When a plurality of cells obtained by the manufacturing method of the present invention are modularized, module efficiency can be kept high because of a reduced variation in voltage and current between cells.

EXAMPLES

Examples of the present invention will be specifically described below, but the present invention is not limited to the Examples below. In the Examples below, the thickness of a thin-film on a textured silicon substrate was determined by observing a cross-section with a transmission electron microscope (TEM). A direction perpendicular to the slope of the texture was set to the thickness direction, and the thickness at the texture valley portion was read from a TEM observation image.

Deposition Experiment Example: Evaluation of Deposition Rate by Plasma Treatment <Formation of Texture on Silicon Substrate>

A 200 μm-thick 6-inch n-type single-crystalline silicon wafer having a plane orientation of (100) was washed in acetone, then immersed in a 2 wt % HF aqueous solution for 3 minutes to remove a silicon oxide film on a surface of the wafer, and rinsed with ultrapure water. The washed silicon substrate was immersed in a 5/15 wt % KOH/isopropyl alcohol aqueous solution at 70° C. for 15 minutes, and rinsed with ultra-pure water to obtain a single-crystalline silicon substrate with pyramidal texture having a (111) plane exposed on its surface.

(Deposition of Intrinsic Silicon Layer) A textured silicon substrate was mounted at an in-plane central portion (3,3-address) on a deposition tray (tray area: 0.93 m², deposition area: 0.67 m²) on which 25 silicon substrates (5 (lines)×5 (rows)) were mountable. A tray having silicon substrates mounted thereon was introduced into a CVD chamber, and deposition was performed for 30 seconds under the condition of a substrate temperature of 150° C., a pressure of 120 Pa, a $H_2/SiH_4$ flow rate ratio of 10/3 and a power density of 11 mW/cm² (hereinafter, the condition is referred to as a "standard deposition conditions") to form an intrinsic silicon layer having a thickness of about 5 nm at texture valley portion.

(Plasma Treatment)

After the intrinsic silicon layer was deposited, plasma discharge was temporarily stopped, and $H_2$ and $SiH_4$ were introduced into a CVD chamber at the $H_2/SiH_4$ flow rate ratio shown in "Plasma treatment condition 1" in Table 1, thereby performing gas replacement. After gas replacement was performed for 30 seconds, plasma discharge was resumed, and plasma treatment was performed for 30 seconds at the $H_2/SiH_4$ flow rate ratio, power density, pressure and substrate temperature shown in "Plasma treatment condition 1" in Table 1.

An intrinsic silicon layer having a thickness of about 5 nm at texture valley portion was formed in the same manner as described above, the $H_2/SiH_4$ flow rate ratio during gas replacement and plasma treatment and the power density during plasma treatment were changed to plasma treatment conditions 2 to 10 shown in Table 1, and gas replacement and plasma treatment for 30 seconds were performed. The $H_2/SiH_4$ flow rate ratio ∞ indicates that $SiH_4$ was not introduced, and only $H_2$ was introduced to perform gas replacement and plasma treatment (hydrogen plasma etching).

<Evaluation Results>

Table 1 shows the hydrogen dilution ratio, ($H_2/SiH_4$ flow rate ratio), the power density, the pressure, the substrate temperature and the deposition rate in "Standard deposition conditions" and "Plasma treatment conditions 1 to 10". The deposition rate was calculated by dividing the thickness change amount $d_1-d_0$, by plasma treatment time, wherein the thickness $d_0$ of the thin-film at the texture valley portion before plasma treatment was measured at three positions in the vicinity of the center of the substrate, the thickness $d_1$ of the thin-film at the texture valley portion after plasma treatment was measured at three positions in the vicinity of the center of the substrate, and a difference between the average of the values of thickness $d_0$ and the average of the values of thickness $d_1$ was determined as a thickness change amount $d_1-d_0$.

TABLE 1

| | | $H_2/SiH_4$ | Power density (mW/cm²) | Pressure (Pa) | Substrate temperature (° C.) | Deposition rate (nm/sec) |
|---|---|---|---|---|---|---|
| Standard deposition conditions | | 3.3 | 11 | 120 | 150 | 0.16 |
| Plasma treatment conditions | 1 | 3000 | 100 | 520 | | -0.08 |
| | 2 | 2000 | | | | 0.01 |
| | 3 | 1000 | | | | 0.03 |
| | 4 | 500 | | | | 0.06 |
| | 5 | 200 | | | | 0.08 |
| | 6 | 100 | | | | 0.11 |
| | 7 | 50 | | | | 0.13 |
| | 8 | ∞ | | | | -0.08 |
| | 9 | 2000 | | 30 | | 0.005 |
| | 10 | ∞ | | | | -0.04 |

As shown in Table 1, it is apparent that in plasma treatment under plasma treatment conditions 8 and 10 (hydrogen plasma etching), the etching rate is high, but introduction of $SiH_4$ in addition to $H_2$ reduces the etching rate, and when the plasma power density is 100 mW/cm², the deposition rate is positive (deposition mode) at a hydrogen dilution ratio of 2000 or less. In addition, it is apparent that from comparison between a case where the power density is 100 mW/cm² during the plasma treatment (Experiment Example 1) and a case where the power density is 30 mW/cm² during the plasma treatment (Experiment Example 5), the deposition rate decreases (the etching rate increases) as the power density during plasma treatment increases. These results show that the deposition rate in plasma treatment can be arbitrarily adjusted by adjusting the $H_2/SiH_4$ flow rate ratio and the plasma power density during the plasma treatment.

Deposition Experiment Example: Evaluation of Thickness Variation Among Batches and within One Batch Experiment Example 1

(Deposition in First Batch)

A textured silicon substrate was mounted at each of an in-plane central portion (3,3-address) and an end portion (1,1-address) on a deposition tray (tray area: 0.93 m², deposition area: 0.67 m²) on which 25 silicon substrates (5 (lines)×5 (rows)) were mountable. A tray having silicon substrates mounted thereon was introduced into a CVD chamber, and deposition was performed for 11 seconds under the standard deposition conditions to form an intrinsic silicon layer (first sublayer) having a thickness of about 2.5 nm.

After the first sublayer was deposited, plasma discharge was temporarily stopped, and $H_2$ and $SiH_4$ were introduced into a CVD chamber at a $H_2/SiH_4$ flow rate ratio of 2000/1 to perform gas replacement. After gas replacement was performed for 30 seconds, plasma discharge was resumed to perform plasma treatment for 20 seconds under plasma treatment condition 1. Plasma discharge was temporarily stopped, gas replacement was performed with $SiH_4$ introduced into the CVD chamber in such a manner that the $H_2/SiH_4$ flow rate ratio was 10/3, plasma discharge was then resumed, and deposition was performed for 11 seconds under the standard deposition conditions to form an intrinsic silicon layer (second sublayer) having a thickness of about 2.5 nm on the first sublayer after plasma treatment.

After deposition of the second sublayer, plasma discharge was temporarily stopped, and $H_2$ and $SiH_4$ were introduced into a CVD chamber at a $H_2/SiH_4$ flow rate ratio of 2000/1 to perform gas replacement for 30 seconds. Thereafter, plasma discharge was resumed to perform hydrogen plasma treatment for 20 seconds under the plasma treatment condition 1. As in the plasma treatment of the first sublayer, the introduction amount of the $SiH_4$ gas during the plasma treatment was adjusted so that the $H_2/SiH_4$ flow rate ratio was 2000/1.

On the intrinsic silicon thin-film in which the surface of the second sublayer is subjected to plasma treatment, a p-type silicon thin-film having a thickness of about 4 nm was deposited under the condition of a substrate temperature of 150° C., a pressure of 60 Pa, a $B_2H_6$-containing $H_2/SiH_4$ flow rate ratio of 3/1 and a power density of 11 mW/cm². As $B_2H_6$-containing $H_2$, a mixed gas with the $B_2H_6$ concentration reduced to 5000 ppm by dilution with $H_2$ was used.

(Deposition in Second to Ninth Batches)

After completion of deposition in the first batch, the deposition tray was taken out from the CVD apparatus, another silicon substrate was mounted at each of the in-plane central portion and the end portion on the deposition tray, and deposition in the second batch was performed. In deposition in the second batch, a series of operations including deposition of first sublayer having a thickness of about 2.5 nm, plasma treatment of the first sublayer, deposition of second sublayer of about 2.5 nm, plasma treatment of the second sublayer, and deposition of a p-type silicon thin-film were performed as in the first batch. The series of operations were repeated until deposition in the ninth batch was completed.

(Deposition and Thickness Measurement in Tenth Batch)

In deposition in the tenth batch, deposition of first sublayer, plasma treatment of the first sublayer, deposition of second sublayer, and plasma treatment of the second sublayer were performed as in the first to ninth batches. Thereafter, the deposition tray was taken out from the CVD apparatus. For each of the silicon substrates disposed at central portion and the end portion of the tray, the thickness of the intrinsic silicon thin-film at the texture valley portion in the vicinity of the center of the silicon substrate was measured at three positions, and the average of the measurements at the three positions was determined as the thickness $d_1$ after plasma treatment.

(Deposition in 11th to 998th Batches)

A series of operations were repeated under the same condition as in the first to ninth batches to perform deposition in 11th to 998th batches.

(Deposition and Thickness Measurement in 999th to 1000th Batches)

In deposition in the 999th batch, a first sublayer was formed, the first sublayer was subjected to plasma treatment, a second sublayer was formed, the deposition tray was taken out from the CVD apparatus, the thickness of the thin-film at the texture valley portion in the vicinity of the center of the silicon substrate was measured at three positions, and the average of the measurements at the three positions was determined as the thickness $d_0$ before plasma treatment. Similarly to deposition in the tenth batch, deposition in the 1000th batch was performed in the following manner: a first sublayer was formed, the first sublayer was subjected to plasma treatment, a second sublayer was formed, the second sublayer was subjected to plasma treatment, the deposition tray was taken out from the CVD apparatus, the thickness of the thin-film at the texture valley portion in the vicinity of the center of the silicon substrate was measured at three positions, and the average of the measurements at the three positions was determined as the thickness $d_1$ after plasma treatment.

Experiment Examples 2 to 4 and Comparative Experiment Examples 1 to 4

The introduction amount of $SiH_4$ in gas replacement before plasma treatment and in plasma treatment was changed so that the $H_2/SiH_4$ flow rate ratio was 1000/1 (Experiment Example 2, plasma treatment condition 3), 500/1 (Experiment Example 3, plasma treatment condition 4), 200/1 (Experiment Example 4, plasma treatment condition 5), 100/1 (Comparative Experiment Example 1, plasma treatment condition 6), 50/1 (Comparative Experiment Example 2, plasma treatment condition 7) and 3000/1 (Comparative Experiment Example 3, plasma treatment condition 1). In Comparative Experiment Example 4 (plasma treatment condition 8), a first sublayer and a second sublayer were subjected to a plasma treatment (hydrogen plasma etching) while $SiH_4$ was not introduced, and only hydrogen was introduced. In these experiment examples, the time for deposition of the intrinsic silicon layer under the standard deposition conditions was adjusted so that the thickness $d_1$ after the plasma treatment was equivalent to that in Experiment Example 1.

Deposition of a film on a silicon substrate was repeated in the same manner as in Experiment Example 1 except that the deposition time and the $SiH_4$ introduction amount during plasma treatment were changed as described above. The thicknesses $d_1$ after plasma treatment in the tenth batch, the thicknesses $d_0$ before plasma treatment in the 999th batch, and the thicknesses $d_1$ after plasma treatment in the 1000th batch were measured.

Experiment Example 5

Deposition of a film on a silicon substrate was repeated in the same manner as in Experiment Example 1 except that plasma treatment was performed with the plasma treatment condition changed to plasma treatment condition 9 (power density: 30 mW/cm²), and the time for deposition of the intrinsic silicon layer was adjusted so that there was substantially no difference in thickness $d_1$ after plasma treatment. The thicknesses $d_1$ after plasma treatment in the tenth batch, the thicknesses $d_0$ before plasma treatment in the 999th batch, and the thicknesses $d_1$ after plasma treatment in the 1000th batch were measured.

Comparative Experiment Example 5

Deposition of a film on a silicon substrate was repeated in the same manner as in Comparative Experiment Example 4 except that plasma treatment was performed with the plasma treatment condition changed to plasma treatment condition 10 (power density: 30 mW/cm²), and the time for deposition of the intrinsic silicon layer was adjusted so that there was substantially no difference in thickness $d_1$ after plasma treatment. The thicknesses $d_1$ after plasma treatment in the tenth batch, the thicknesses $d_0$ before plasma treatment in the 999th batch, and the thicknesses $d_1$ after plasma treatment in the 1000th batch were measured.

Comparative Experiment Example 6

Deposition was performed under the standard deposition conditions for 25 seconds to form an intrinsic silicon layer having a thickness of about 4 nm. Thereafter, a p-type silicon thin-film was deposited on the intrinsic silicon layer without performing a plasma treatment. The series of operations were repeated to measure the thickness of each of intrinsic silicon thin-films in the tenth and 1000th batches.

Table 2 shows plasma treatment conditions and thickness measurement results in Experiment Examples and Comparative Experiment Examples. For the thicknesses variation within one batch, a difference between a thickness of an intrinsic silicon thin-film deposited and plasma-treated on a substrate at a tray end portion and a thickness of an intrinsic silicon thin-film deposited and plasma-treated on a substrate at a tray central portion is expressed in terms of a percentage. For the thicknesses variation among batches, a difference between a thickness $d_1$ after plasma treatment in the tenth batch and a thickness $d_1$ after plasma treatment in the 1000th batch is expressed in terms of a percentage.

batch-to-batch thickness variation (difference between averages in the tenth batch and the 1000th batch) of the thin-film on the substrate disposed at the center of the tray. Further, in these Comparative Experiment Examples, there was a very large thickness variation within the 1000th batch.

In Experiment Examples 1 to 4 where the $H_2/SiH_4$ flow rate ratio during the plasma treatment was 200/1 to 2000/1, the thickness variation within one batch was about 1% or less in the 1000th batch. In Comparative Experiment Examples 1 and 2 where the $SiH_4$ flow rate was further increased, the thickness variation within one batch was larger in the 1000th batch.

In the Comparative Experiment Examples, a variation in deposition amount (etching amount) in plasma treatment may be a cause of the thickness variation because there is a small variation in thickness $d_0$ within the 999th batch. It is apparent that in the Experiment Examples, the introduction

TABLE 2

| | $H_2/SiH4$ Power density (mW/cm$^2$) | Substrate position | Tenth batch $d_1$ | 1000th batch $d_0$ | 1000th batch $d_1$ | 1000th batch $d_1-d_0$ | Variation in thickness $d_1$ among batches (%) |
|---|---|---|---|---|---|---|---|
| Experiment Example 1 | 2000 | End portion (nm) | 5.4 | 5.2 | 5.4 | 0.2 | 0.6 |
| | | Central portion (nm) | 5.0 | 5.2 | 5.0 | −0.2 | 0.4 |
| | 100 | Thickness variation within batch (%) | 6.8 | 0.2 | 7.0 | | |
| Experiment Example 2 | 1000 | End portion (nm) | 5.2 | 5.0 | 5.2 | 0.2 | 0.0 |
| | | Central portion (nm) | 5.1 | 5.0 | 5.2 | 0.2 | 0.2 |
| | 100 | Thickness variation within batch (%) | 0.2 | 0.2 | 0.0 | | |
| Experiment Example 3 | 500 | End portion (nm) | 5.0 | 4.2 | 5.0 | 0.8 | 0.0 |
| | | Central portion (nm) | 5.0 | 4.2 | 5.0 | 0.8 | 0.2 |
| | 100 | Thickness variation within batch (%) | 0.2 | 0.0 | 0.0 | | |
| Experiment Example 4 | 200 | End portion (nm) | 4.9 | 3.5 | 4.9 | 1.4 | 0.2 |
| | | Central portion (nm) | 4.9 | 3.5 | 4.9 | 1.4 | 0.4 |
| | 100 | Thickness variation within batch (%) | 0.0 | 0.9 | 0.2 | | |
| Comparative Experiment Example 1 | 100 | End portion (nm) | 4.7 | 3.0 | 4.7 | 1.7 | 1.5 |
| | | Central portion (nm) | 4.8 | 3.0 | 4.7 | 1.7 | 1.3 |
| | 100 | Thickness variation within batch (%) | 0.8 | −0.7 | 1.1 | | |
| Comparative Experiment Example 2 | 50 | End portion (nm) | 4.6 | N.D. | 4.6 | | 0.2 |
| | | Central portion (nm) | 4.8 | | 4.7 | | 1.7 |
| | 100 | Thickness variation within batch (%) | 3.5 | | 2.1 | | |
| Comparative Experiment Example 3 | 3000 | End portion (nm) | 5.4 | N.D | 5.4 | | 0.7 |
| | | Central portion (nm) | 5.3 | | 4.5 | | 17.8 |
| | 100 | Thickness variation within batch (%) | 1.1 | | 20.0 | | |
| Comparative Experiment Example 4 | ∞ | End portion (nm) | 5.3 | 7.5 | 5.2 | −2.3 | 1.3 |
| | | Central portion (nm) | 5.2 | 7.4 | 3.9 | −3.5 | 32.7 |
| | 100 | Thickness variation within batch (%) | 1.9 | 0.9 | 33.4 | | |
| Experiment Example 5 | 2000 | End portion (nm) | 5.0 | 4.5 | 5.1 | 0.5 | 1.0 |
| | | Central portion (nm) | 5.1 | 4.5 | 5.1 | 0.6 | 0.6 |
| | 30 | Thickness variation within batch (%) | 1.8 | 0.4 | 1.4 | | |
| Comparative Experiment Example 5 | ∞ | End portion (nm) | 5.6 | N.D. | 5.6 | | 0.9 |
| | | Central portion (nm) | 5.0 | | 5.4 | | 7.8 |
| | 30 | Thickness variation within batch (%) | 11.4 | | 3.7 | | |
| Comparative Experiment Example 6 | — | End portion (nm) | 4.1 | | 4.2 | | 2.4 |
| | | Central portion (nm) | 4.1 | | 4.2 | | 2.6 |
| | | Thickness variation within batch (%) | 0.2 | | 0.0 | | |

It is apparent that in Comparative Experiment Examples 4 and 5 where $SiH_4$ was not introduced, and only $H_2$ was introduced to perform plasma treatment, and Comparative Experiment Example 3 where the $H_2/SiH_4$ flow rate ratio during plasma treatment was 3000/1, there was a very large amount of $SiH_4$ (hydrogen dilution ratio) during plasma treatment is adjusted to perform plasma treatment in a deposition mode, whereby even when the number of continuous deposition batches increases, a variation in deposition amount in plasma treatment is suppressed, so that it is possible to reduce a variation within one batch and a batch-to-batch variation in thickness of the intrinsic silicon thin-film after plasma treatment.

Preparation Example of Solar Cell

In the following Examples and Comparative Examples, deposition and plasma treatment were performed under the same conditions as in the above-described Experiment Examples and Comparative Experiment Examples. Thereafter, solar cells were prepared, and the power generation characteristics thereof were evaluated.

Example 1

(CVD Film Formation on p-Layer Side)

A textured silicon substrate was mounted at each of an in-plane central portion (3,3-address) and an end portion (1,1-address) on a deposition tray on which 25 silicon substrates (5 (lines)×5 (rows)) were mountable. A tray with a silicon substrate mounted thereon was introduced into a CVD chamber, and on the silicon substrate, deposition of about 2.5 nm-thick first sublayer under the standard deposition conditions, plasma treatment of the first sublayer, deposition of about 2.5 nm-thick second sublayer, plasma treatment of the second sublayer, and deposition of a p-type silicon thin-film were performed under the same condition as in Experiment Example 1. The tray was replaced, and deposition was performed in 1000 batches under the same condition as described above.

(Preparation of Solar Cell)

Among substrates on which the silicon thin-film was formed on the p-layer side, four substrates, i.e., two substrates in the tenth batch and two substrates in the 1000th batch were taken out, and a heterojunction solar cell was prepared. An intrinsic silicon thin-film having a thickness of 6 nm was deposited on a silicon thin-film-non-formed surface (back side) of the silicon substrate under the standard deposition conditions, and an n-type silicon thin-film having a thickness of about 4 nm was deposited thereon under the condition of a substrate temperature of 150° C., a pressure of 60 Pa, a $PH_3$-containing $H_2/SiH_4$ flow rate ratio of 3/1 and a power density of 11 $mW/cm^2$. As $PH_3$-containing $H_2$, a mixed gas with the $PH_3$ concentration reduced to 5000 ppm by dilution with $H_2$ was used.

An ITO transparent electroconductive film having a thickness of 80 nm was deposited on each of the n-type silicon thin-film and the p-type silicon thin-film. The transparent electroconductive film was deposited under the condition of a substrate temperature of 150° C., an argon/oxygen flow rate of 50 sccm/1 sccm, a pressure of 0.2 Pa and a power density of 0.5 $W/cm^2$ by a sputtering method using an ITO sintered target having a tin oxide content of 5% by weight. A silver paste was applied in a comb shape on the transparent electroconductive layer by screen printing, and heated at 150° C. for 1 hour to obtain a solar cell for evaluation.

Examples 2 to 5 and Comparative Examples 1 to 6

The conditions for CVD film formation and plasma treatment of the silicon thin-film on the p-layer side was changed to the same condition as in Experiment Examples 2 to 5 and Comparative Experiment Examples 1 to 6. Deposition was performed in 1000 batches in the same manner as in Example 1 except for the above, and solar cells for evaluation were prepared using the substrates in the tenth batch and the 1000th batch.

<Evaluation Results>

The power generation characteristics of the solar cell obtained in each of Examples and Comparative Examples were measured under photoirradiation with an AM of 1.5 and 100 $mW/cm^2$ at a temperature of 25° C. In Table 3, the open circuit voltage (Voc), the short circuit current (Isc), the fill factor (FF) and the maximum power (Pmax) are each shown as a relative value where the value for a cell in the tenths batch (a cell obtained by performing deposition at the tray end portion) in Comparative Example 6 is set to 1. The "difference" in Table 3 is a difference between the value at the end portion and the value at the central portion in the same batch, and ΔPmax is a difference between Pmax of the cell in the tenth batch and Pmax of the cell in the 1000th batch.

TABLE 3

| | Plasma treatment $H_2/SiH_4$ Power density ($mW/cm^2$) | Substrate position | Conversion characteristics (relative values) | | | | | | | | |
|---|---|---|---|---|---|---|---|---|---|---|---|
| | | | Tenth batch | | | | 1000th batch | | | | |
| | | | Voc | Isc | FF | Pmax | Voc | Isc | FF | Pmax | ΔPmax |
| Example 1 | 2000 | End portion | 1.053 | 1.011 | 1.021 | 1.087 | 1.048 | 1.009 | 1.023 | 1.082 | 0.005 |
| | | Central portion | 1.052 | 1.010 | 1.022 | 1.086 | 1.040 | 1.010 | 1.025 | 1.077 | 0.009 |
| | 100 | Difference | 0.001 | 0.001 | −0.001 | 0.001 | 0.008 | −0.001 | −0.002 | 0.005 | |
| Example 2 | 1000 | End portion | 1.056 | 1.010 | 1.022 | 1.090 | 1.054 | 1.010 | 1.024 | 1.090 | 0.000 |
| | | Central portion | 1.053 | 1.008 | 1.022 | 1.022 | 1.048 | 1.011 | 1.025 | 1.086 | −0.001 |
| | 100 | Difference | 0.003 | 0.002 | 0.000 | 0.000 | 0.006 | −0.001 | −0.001 | 0.004 | |
| Example 3 | 500 | End portion | 1.055 | 1.007 | 1.026 | 1.090 | 1.055 | 1.007 | 1.025 | 1.089 | 0.001 |
| | | Central portion | 1.053 | 1.008 | 1.027 | 1.090 | 1.056 | 1.007 | 1.027 | 1.092 | −0.002 |
| | 100 | Difference | 0.002 | −0.001 | −0.001 | 0.000 | −0.001 | 0.000 | −0.002 | −0.003 | |
| Example 4 | 200 | End portion | 1.056 | 1.006 | 1.018 | 1.081 | 1.056 | 1.006 | 1.018 | 1.081 | 0.000 |
| | | Central portion | 1.053 | 1.008 | 1.015 | 1.077 | 1.056 | 1.008 | 1.016 | 1.081 | −0.004 |
| | 100 | Difference | 0.003 | −0.002 | 0.003 | 0.004 | 0.000 | −0.002 | −0.002 | 0.000 | |
| Comparative Example 1 | 100 | End portion | 1.034 | 1.007 | 1.008 | 1.050 | 1.037 | 1.005 | 1.006 | 1.048 | 0.001 |
| | | Central portion | 1.039 | 1.004 | 1.009 | 1.053 | 1.041 | 1.003 | 1.009 | 1.054 | −0.001 |
| | 100 | Difference | −0.005 | 0.003 | −0.001 | −0.003 | −0.004 | 0.002 | −0.003 | −0.005 | |
| Comparative Example 2 | 50 | End portion | 1.025 | 1.007 | 1.006 | 1.038 | 1.026 | 1.005 | 1.006 | 1.037 | 0.001 |
| | | Central portion | 1.028 | 1.004 | 1.003 | 1.035 | 1.030 | 1.003 | 1.003 | 1.036 | −0.001 |
| | 100 | Difference | −0.003 | 0.003 | 0.003 | 0.003 | −0.004 | 0.002 | 0.003 | 0.001 | |

TABLE 3-continued

| | Plasma treatment $H_2/SiH_4$ Power density $(mW/cm^2)$ | Substrate position | Conversion characteristics (relative values) | | | | | | | | |
|---|---|---|---|---|---|---|---|---|---|---|---|
| | | | Tenth batch | | | | 1000th batch | | | | |
| | | | Voc | Isc | FF | Pmax | Voc | Isc | FF | Pmax | ΔPmax |
| Comparative Example 3 | 3000 | End portion | 1.062 | 1.013 | 1.019 | 1.096 | 1.041 | 1.009 | 1.015 | 1.066 | 0.030 |
| | | Central portion | 1.063 | 1.011 | 1.021 | 1.097 | 1.019 | 1.011 | 1.007 | 1.037 | 0.060 |
| | 100 | Difference | −0.001 | 0.002 | −0.002 | −0.001 | 0.022 | −0.002 | 0.008 | 0.029 | |
| Comparative Example 4 | ∞ | End portion | 1.065 | 1.014 | 1.019 | 1.100 | 1.048 | 1.004 | 1.015 | 1.068 | 0.032 |
| | | Central portion | 1.053 | 1.011 | 1.025 | 1.091 | 1.015 | 1.004 | 1.008 | 1.027 | 0.064 |
| | 100 | Difference | 0.012 | 0.003 | −0.006 | 0.009 | 0.033 | 0.000 | 0.007 | 0.041 | |
| Example 5 | 2000 | End portion | 1.030 | 1.011 | 1.015 | 1.056 | 1.028 | 1.011 | 1.019 | 1.059 | −0.003 |
| | | Central portion | 1.039 | 1.010 | 1.019 | 1.060 | 1.022 | 1.012 | 1.017 | 1.052 | 0.008 |
| | 30 | Difference | −0.001 | 0.001 | −0.004 | −0.004 | 0.006 | −0.001 | 0.002 | 0.007 | |
| Comparative Example 5 | ∞ | End portion | 1.025 | 1.014 | 1.013 | 1.053 | 1.025 | 1.004 | 1.015 | 1.045 | 0.008 |
| | | Central portion | 1.019 | 1.011 | 1.017 | 1.048 | 1.010 | 1.014 | 1.009 | 1.033 | 0.014 |
| | 30 | Difference | 0.006 | 0.003 | −0.004 | 0.005 | 0.015 | −0.010 | 0.006 | 0.011 | |
| Comparative Example 6 | — | End portion | 1 | 1 | 1 | 1 | 0.999 | 1.000 | 1.002 | 1.001 | −0.001 |
| | | Central portion | 0.989 | 1.008 | 1.004 | 1.001 | 0.989 | 1.008 | 1.001 | 0.998 | 0.003 |
| | | Difference | 0.011 | −0.008 | −0.004 | −0.001 | 0.010 | −0.008 | 0.001 | 0.003 | |

Comparison among cells in the tenth batch in Examples and Comparative Examples shows that in Examples 1 to 5 and Comparative Examples 1 to 5 where the plasma treatment was performed, higher Pmax was exhibited, and conversion characteristics were improved by the plasma treatment as compared to Comparative Example 6 where the plasma treatment was not performed. In particular, conversion efficiency was remarkably improved in Examples 1 to 4 and Comparative Examples 3 and 4 where the first sublayer was subjected to an intermediate plasma treatment and the second sublayer was subjected to a plasma treatment at a plasma power of 100 mW/cm² with $H_2$ introduced in an amount of not less than 200 times the amount of $SiH_4$. In Examples 1 to 4, the difference in Pmax between the cell at the end portion and the cell at the central portion in the same batch was less than 1%, and there was no significant variation in conversion efficiency within the same batch.

In Comparative Examples 4 and 5 where only $H_2$ was introduced during the plasma treatment, the cell in the tenth batch had high conversion efficiency, but the conversion characteristics of the cell in the 1000th batch were markedly deteriorated. In particular, the cell at the central portion has high ΔPmax, and there is a large variation in characteristics within one batch and among batches. In other words, although the characteristics of the cell in the initial batch of deposition can be improved by the hydrogen plasma etching, the characteristics of the cell are deteriorated with an increase in the number of continuous deposition batches, and a characteristic variation within one batch is increased. In Comparative Example 3 where the $H_2/SiH_4$ flow rate ratio during the plasma treatment was 3000/1, there was a large variation in characteristics within one batch and among batches as in Comparative Examples 4 and 5.

It is apparent that in Examples 1 to 5 where the $H_2/SiH_4$ flow rate ratio during the plasma treatment was 200/1 to 2000/1, the cell in the 1000th batch retained high conversion characteristics, and the variation in characteristics within one batch was small. In particular, Example 2 with a $H_2/SiH_4$ flow ratio 1/1000, Example 3 with a $H_2/SiH_4$ flow ratio 1/500, and Example 4 with a $H_2/SiH_4$ flow ratio 1/200 showed high conversion characteristics.

Comparison of the thickness evaluation results in Table 2 with the results of evaluation of conversion characteristics in Table 3 shows that there is a high correlation between a thickness variation in each of Experiment Examples and Comparative Experiment Examples (Table 2) and a variation in characteristics of the solar cell in each of Examples and Comparative Examples (Table 3). That is, in Comparative Examples, the thickness variation increases with an increase in the number of continuous deposition batches, and accordingly, a variation in characteristics occurs. On the other hand, it is apparent that in Examples, the distribution of the thickness of the intrinsic silicon thin-film within one batch and among batches is reduced while the passivation effect by the plasma treatment is maintained, so that the effect of improving conversion characteristics by the plasma treatment can be maintained even when the number of continuous deposition batches is increased.

In Comparative Examples 1 and 2 where the $SiH_4$ introduction amount during the plasma treatment is large (hydrogen dilution ratio is small), the thickness variation in the 1000th batch is smaller, and the variation in conversion characteristics is smaller as compared to Comparative Examples 4 and 5. However, in both the tenth batch and the 1000th batch, the conversion characteristics are low, and the effect of improving characteristics by the plasma treatment is not sufficient. This may be because the deposition rate in the plasma treatment is high, and thus deposition of the silicon thin-film occurs more preferentially than penetration of hydrogen plasma into the silicon thin-film (sublayer), so that improvement of Voc was insufficient due to low passivation effect by hydrogen plasma. In addition, improvement of conversion characteristics is considered to be hindered by the following factor: deposition rate during plasma treatment is large, leading to formation of a high-hydrogen-concentration interface layer in a significant thickness, so that microcrystalline silicon is easily generated.

In Example 5 where the power density during plasma treatment was 30 mW/cm², the thickness variation in the 1000th batch was small, and higher conversion characteristics were exhibited as compared to Comparative Examples 1 and 2. On the other hand, it is apparent that conversion characteristics in Example 5 were lower than those in Example 1. This may be because in Example 5, the power density during the plasma treatment is low, and the passivation effect by hydrogen plasma is small.

The above-mentioned results show that by appropriately adjusting the introduction amount of the silicon-containing gas (hydrogen dilution ratio) and the plasma power density during the plasma treatment, a solar cell excellent in conversion efficiency can be obtained. In addition, it is apparent that a variation in conversion characteristics occurs with an increase in the number of batches of continuous deposition of the silicon-based thin-film when a hydrogen plasma etching is performed, whereas a variation in cell characteristics within one batch and among batches can be reduced by performing a plasma treatment with introducing a slight amount of silicon-containing gas such that an amorphous silicon is formed.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A method for manufacturing a crystalline silicon-based solar cell, the method comprising:

performing a plasma treatment on a plurality of conductive single-crystalline silicon substrates in a chemical vapor deposition (CVD) chamber, each of the conductive single-crystalline silicon substrates having an intrinsic silicon-based layer on a first principal surface thereof, wherein the first principal surface of the conductive single-crystalline silicon substrates has a pyramidal texture comprising a plurality of projections, each having a top portion, a middle portion, and a valley portion, wherein the plasma treatment comprises introducing a hydrogen gas and a silicon containing gas into the CVD chamber and exposing a surface of the intrinsic silicon-based layer to hydrogen plasma, wherein an amount of the hydrogen gas introduced into the CVD chamber during the plasma treatment is 150 to 2500 times an amount of the silicon-containing gas introduced into the CVD chamber wherein the plasma treatment forms a first thin-film on the intrinsic silicon-based layer at least at the valley portion, wherein the crystalline silicon-based solar cell comprises:
        the conductive single-crystalline silicon substrate;
        an intrinsic silicon-based thin-film comprising the silicon-based layer and the first thin-film; and
        a conductive silicon-based thin-film, wherein the intrinsic silicon-based thin-film and the conductive silicon-based thin-film are disposed in this order on the first principal surface of the conductive single-crystalline silicon substrate, and wherein forming the intrinsic silicon-based layer is performed on the first principal surface of the conductive single-crystalline silicon substrate by plasma-enhanced CVD with a silicon containing gas and a hydrogen gas introduced into a CVD chamber, and an amount of the hydrogen gas introduced into the CVD chamber during the formation of the intrinsic silicon-based layer is less than 50 times an amount of the silicon containing gas introduced into the CVD chamber.

2. The method according to claim 1, wherein the first thin-film formed by the plasma treatment is intrinsic amorphous silicon.

3. The method according to claim 1, wherein a power density during the plasma treatment is 55 to 1000 mW/cm$^2$.

4. The method according to claim 1, wherein a product of a power density during the plasma treatment and a ratio of the amount of the hydrogen gas introduced into the CVD chamber to the amount of the silicon containing gas introduced into the CVD chamber is 15000 to 150000 mW/cm$^2$.

5. The method according to claim 1,
    wherein at the valley portion, a difference $d_1-d_0$ is 1.5 nm or less,
    wherein $d_1$ is a thickness of the intrinsic silicon-based thin-film after the plasma treatment and $d_0$ is a thickness of the intrinsic silicon-based layer before the plasma treatment.

6. The method according to claim 5, wherein a value of $(d_1-d_0)/d_1$ is greater than 0 and not more than 0.2.

7. The method according claim 1, wherein a deposition rate of the first thin-film at the valley portion during the plasma treatment is 0.1 nm/second or less.

8. The method according to claim 1, wherein the first thin-film is also formed at a top portion during the plasma treatment.

9. The method according to claim 1, wherein the formation of the intrinsic silicon-based layer and the plasma treatment are performed in the same CVD chamber.

10. The method according to claim 1, wherein the intrinsic silicon-based thin-film comprises n sublayers consisting of first to nth sublayers arranged in this order on the conductive single-crystalline silicon substrate, n is an integer of 2 or more, each of the first to nth sublayers is an intrinsic amorphous silicon-based layer, and the plasma treatment is performed after the formation of at least one of the first to nth sublayers.

11. The method according to claim 10, wherein the plasma treatment is performed after the formation of the first sublayer.

12. The method according to claim 10, wherein the first sublayer has a thickness of 1 to 6 nm.

13. The method according to claim 10, wherein the plasma treatment is performed after formation of the nth sublayer.

14. The method according to claim 10, wherein n is 2.

15. The method according to claim 10, wherein each of the sublayers has a thickness of 1 to 6 nm.

* * * * *